(12) United States Patent
Chen et al.

(10) Patent No.: US 12,525,481 B2
(45) Date of Patent: Jan. 13, 2026

(54) CLAMP ASSEMBLY

(71) Applicant: CHIPBOND TECHNOLOGY CORPORATION, Hsinchu (TW)

(72) Inventors: Ching-Wen Chen, Hsinchu County (TW); Chen-Lung Teng, Hsinchu (TW); Kung-An Lin, Hsinchu (TW); Chen-Yu Wang, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 427 days.

(21) Appl. No.: 18/137,799

(22) Filed: Apr. 21, 2023

(65) Prior Publication Data

US 2023/0420287 A1    Dec. 28, 2023

(30) Foreign Application Priority Data

Jun. 22, 2022  (TW) .................................. 111123310

(51) Int. Cl.
  *H01L 21/687*    (2006.01)
  *H01L 21/67*     (2006.01)
(52) U.S. Cl.
  CPC .. *H01L 21/68721* (2013.01); *H01L 21/67092* (2013.01); *H01L 21/68728* (2013.01); *H01L 21/68735* (2013.01)
(58) Field of Classification Search
  None
  See application file for complete search history.

(56) References Cited

U.S. PATENT DOCUMENTS

| | | | |
|---|---|---|---|
| 2013/0219693 A1* | 8/2013 | Wu | H01L 21/68728 29/559 |
| 2015/0258553 A1* | 9/2015 | Kobayashi | H01L 21/67109 427/372.2 |
| 2019/0390359 A1 | 12/2019 | Seki et al. | |
| 2020/0279766 A1* | 9/2020 | Lin | B08B 3/08 |

(Continued)

FOREIGN PATENT DOCUMENTS

| | | | | |
|---|---|---|---|---|
| DE | 102016202073 A1 * | 8/2016 | ....... | H01L 21/68721 |
| JP | 2005-187910 A | 7/2005 | | |

(Continued)

OTHER PUBLICATIONS

Taiwanese Notice of Allowance mailed Mar. 10, 2023 for Taiwanese Patent Application No. 111123310, 3 pages.

(Continued)

*Primary Examiner* — Steven M Marsh
(74) *Attorney, Agent, or Firm* — Demian K. Jackson; Jackson IPG PLLC

(57) ABSTRACT

A clamp assembly includes at least one clamp which is provided to clamp a workpiece in electroless plating, etching, electroplating or cleaning process. The clamp includes a base, a clamping element and a limiting element. The base is mounted on a carrier and includes a guide hole and a first limiting hole which are communicated with each other. The clamping element includes a guide rod and a second limiting hole, the guide rod is inserted into the guide hole to allow the second limiting hole located on the guide hole to be communicated with the first limiting hole. The limiting element is inserted into the first and second limiting holes to integrate the base with the clamping element for clamping the workpiece.

11 Claims, 4 Drawing Sheets

(56) References Cited

U.S. PATENT DOCUMENTS

2023/0339055 A1* 10/2023 Masada ............. H01L 21/68785
2024/0395620 A1* 11/2024 Ryu .................... H01L 21/6836
2025/0029865 A1* 1/2025 Murayama ........ H01L 21/67248

FOREIGN PATENT DOCUMENTS

| | | |
|---|---|---|
| JP | 2020-084215 A | 6/2020 |
| KR | 20-1997-0015284 U | 4/1997 |
| KR | 20-1998-0009720 U | 4/1998 |
| KR | 10-1999-0073677 A | 10/1999 |
| KR | 10-2007-0072070 A | 7/2007 |
| KR | 10-2021-0025286 A | 3/2021 |
| TW | I641079 B | 11/2018 |
| TW | 202133319 A | 9/2021 |

OTHER PUBLICATIONS

Korean notice of allowance mailed Mar. 17, 2025 for Korean patent application No. 10-2023-0052533, 2 pages.
Japanese notice of allowance mailed May 21, 2024 for Japanese patent application No. 2023-069287, 3 pages.
Korean office action mailed Jul. 25, 2024 for Korean patent application No. 10-2023-0052533, 6 pages.

* cited by examiner

CLAMP ASSEMBLY

FIELD OF THE INVENTION

This invention relates to a clamp assembly, and more particularly to a clamp assembly used in electroless plating, etching, electroplating or cleaning process for wafers.

BACKGROUND OF THE INVENTION

Taiwan Patent TW I641079 (application No. 107112396) discloses a wafer clamp used in electroplating apparatus. A linking ring 3 and an electroplating carrier 4 are mounted on a carrier 2, the electroplating carrier 4 is fixed on the carrier 2, and a wafer B can be placed on the electroplating carrier 4. The electroplating carrier 4 is covered by an upper cap 5 to allow the wafer B to be located between the upper cap 5 and the electroplating carrier 4. The linking ring 3 is rotated by an actuating rod 6 to lock and fix the upper cap 5, thereby positioning the wafer B between the upper cap 5 and the electroplating carrier 4.

However, after the electroplating or cleaning process, liquid used in electroplating or cleaning process may remain on the linking ring 3, the electroplating carrier 4, the upper cap 5 and the actuating rod 6 to cause residual liquid contamination. Additionally, the linking ring 3 is rotated by the actuating rod 6 to be integrated with the upper cap 5 so it is not easy to take or place the wafer B on the electroplating carrier 4.

SUMMARY

One object of the present invention is to provide a clamp assembly which can be used in electroless plating, etching, electroplating or cleaning process for wafers. Contamination caused by residual electroplating liquid or residual clean liquid is avoidable in the clamp assembly, and a clamp of the clamp assembly can be disassembled and assembled quickly to simplify workflow.

A clamp assembly of the present invention includes at least one clamp which is provided to clamp a workpiece. The clamp includes a base, a clamping element and a limiting element. The base is designed to be mounted on a carrier and includes a body, a guide hole and a first limiting hole, the body includes a first clamping portion, the guide hole and the first limiting hole are formed on the body, communicated with each other and arranged with an included angle. The clamping element includes a guide rod, a second limiting hole and a second clamping portion, the second limiting hole is formed on the guide rod, and the guide rod is designed to be inserted into the guide hole to allow the second limiting hole to be communicated with the first limiting hole. The limiting element is designed to be inserted into the first and second limiting holes to integrate the base with the clamping element and allow the workpiece to be clamped between the first and second clamping portions.

The limiting element of the present invention is provided to be inserted into the first and second limiting holes, thus the base and the clamping element can be assembled and separated easily and quickly. Furthermore, structures of the base, the clamping element and the limiting element are simple so electroplating liquid or cleaning liquid will not be remained in the clamp assembly, and contamination caused by residual liquid is avoidable.

DETAILED DESCRIPTION OF THE INVENTION

Figure 1:
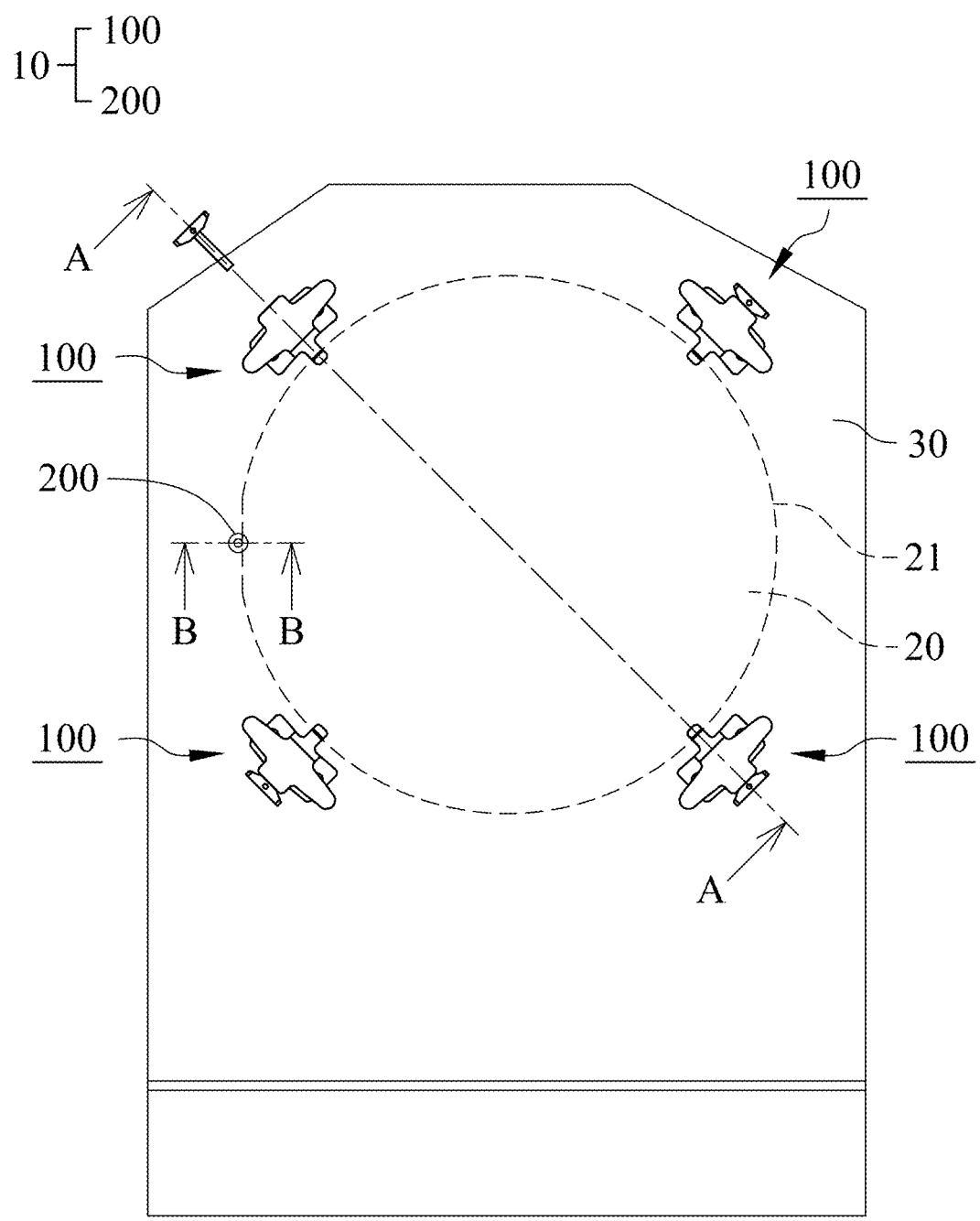
FIG. 1 is a top view illustrating a clamp assembly in accordance with one embodiment of the present invention.
Figure 2:
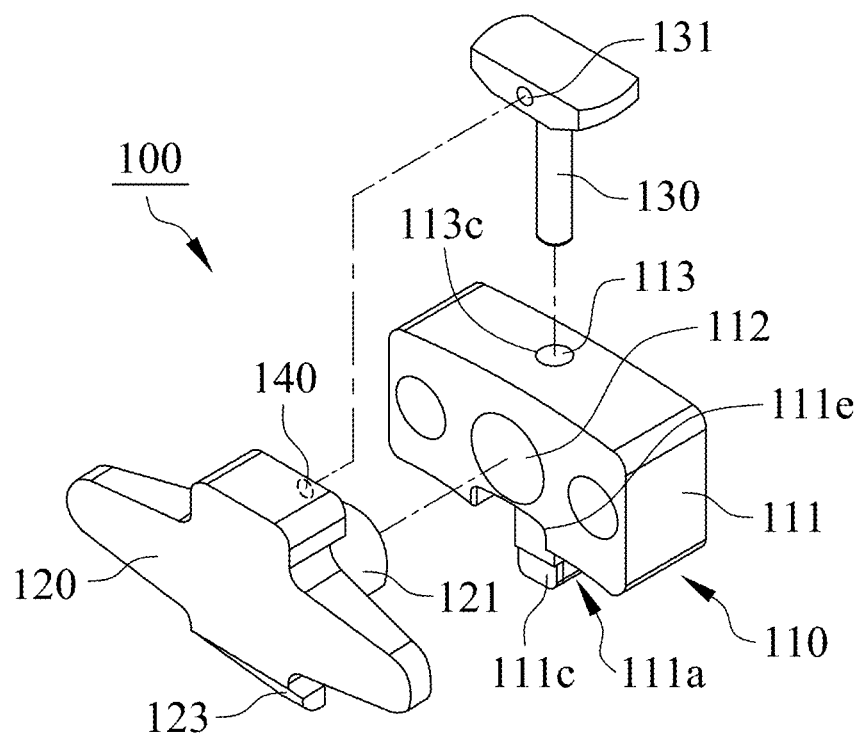
FIG. 2 is an exploded perspective view illustrating a clamp of a clamp assembly in accordance with one embodiment of the present invention.

With reference to FIGS. 1 and 2, a clamp assembly 10 in accordance with one embodiment of the present invention includes at least one clamp 100 which is provided to clamp a workpiece 20 (e.g. wafer) in electroless plating, etching, electroplating or cleaning process. Preferably, the clamp assembly 10 further includes a blocking element 200.

Figure 5:
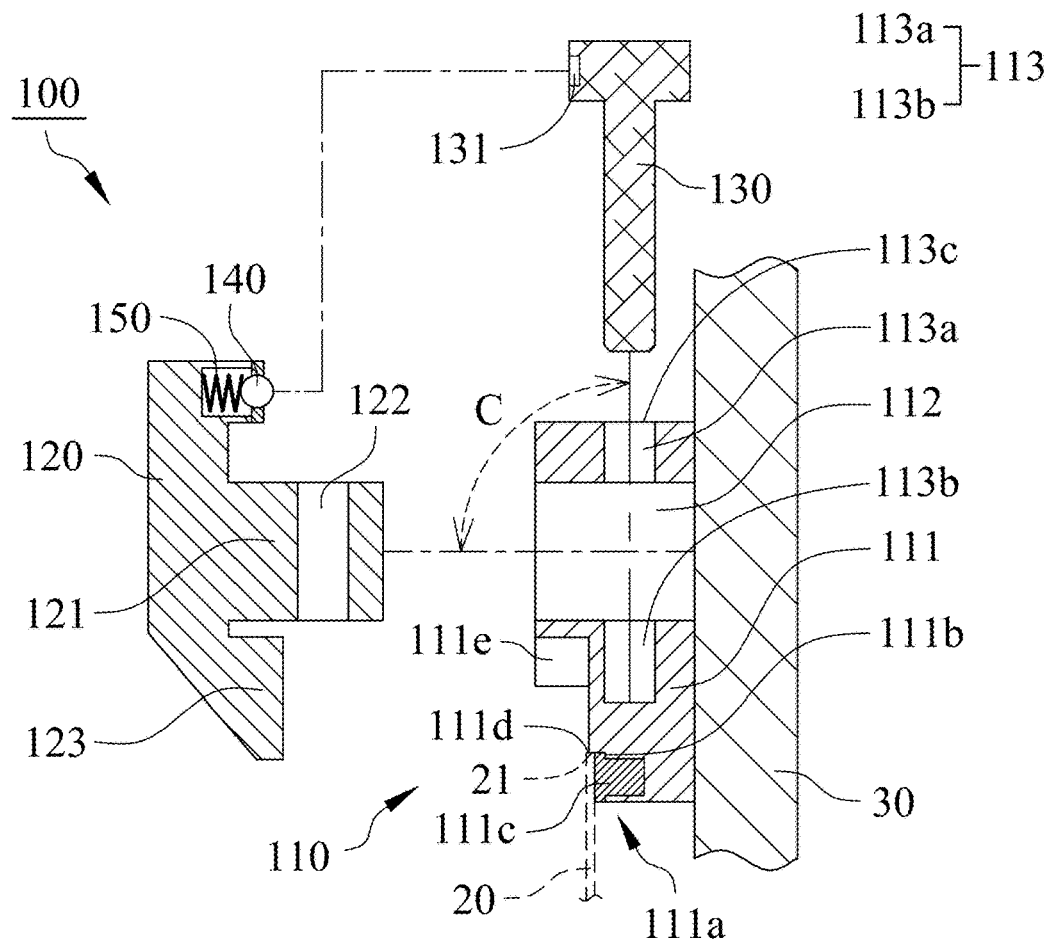
FIG. 5 is a cross-section exploded view illustrating a clamp of a clamp assembly in accordance with one embodiment of the present invention.

With reference to FIGS. 1, 2 and 5, the clamp 100 includes a base 110, a clamping element 120 and a limiting element 130, and preferably, the clamp 100 further includes a positioning element 140 and an elastic element 150. The base 110 and the blocking element 200 can be mounted on a carrier 30 and integrated with the carrier 30.

Figure 3:
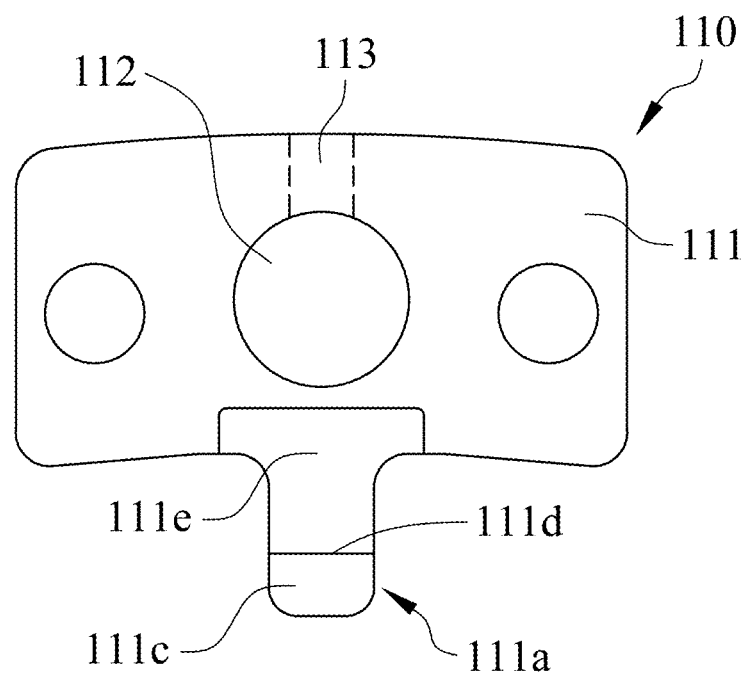
FIG. 3 is a front view illustrating a base of a clamp in accordance with one embodiment of the present invention.

With reference to FIGS. 2, 3 and 5, the base 110 includes a body 111 having a first clamping portion 111a, a guide hole 112 and a first limiting hole 113. The guide hole 112 and the first limiting hole 113 are formed on the body 111, communicated with each other and arranged with an included angle C. The guide hole 112 can be a circular hole or a non-circular hole such as oval hole, rectangular hole or polygonal hole, and in this embodiment, the guide hole 112 is a circular hole. The first limiting hole 113 is divided into a first portion 113a located on one side of the guide hole 112 and a second portion 113b located on the other side of the guide hole 112, and the guide hole 112 is in communication with the first portion 113a and the second portion 113b of the guide hole 113.

Figure 4:
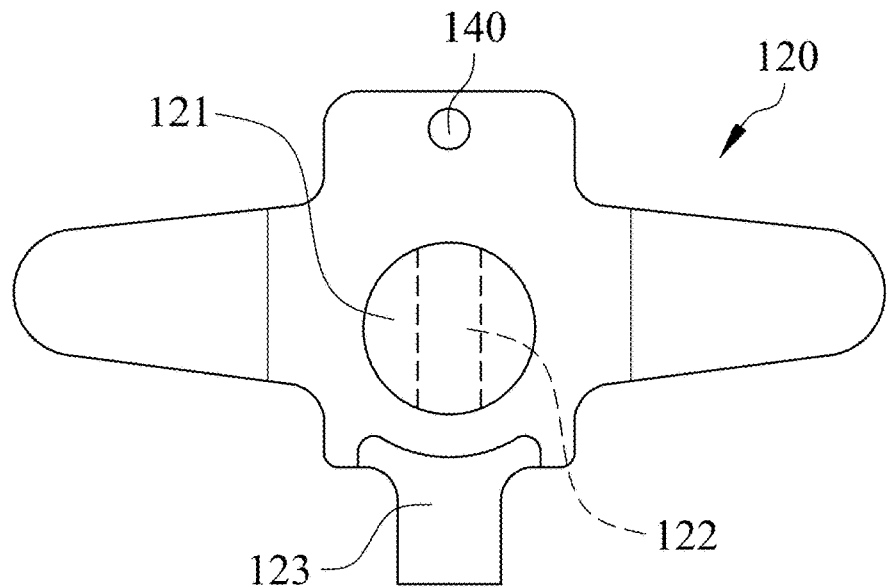
FIG. 4 is a back view illustrating a clamping element of a clamp of a clamp assembly in accordance with one embodiment of the present invention.

With reference to FIGS. 2, 4 and 5, the clamping element 120 includes a guide rod 121, a second limiting hole 122 and a second clamping portion 123, the second limiting hole 122 is arranged on the guide rod 121. The guide rod 121 can be a circular rod or a non-circular rod (e.g. oval rod, rectangular rod or polygonal rod), and in this embodiment, the guide rod 121 is a circular rod.

With reference to FIG. 5, in this embodiment, the positioning element 140 and the elastic element 150 are mounted on the clamping element 120, and the elastic element 150 is provided to push the positioning element 140. In another embodiment, the clamp 100 does not include the elastic element 150, the positioning element 140 is a ball which is rotationally mounted on the clamping element 120. And in another embodiment, the positioning element 140 is fixedly mounted on the clamping element 120.

Figure 6:
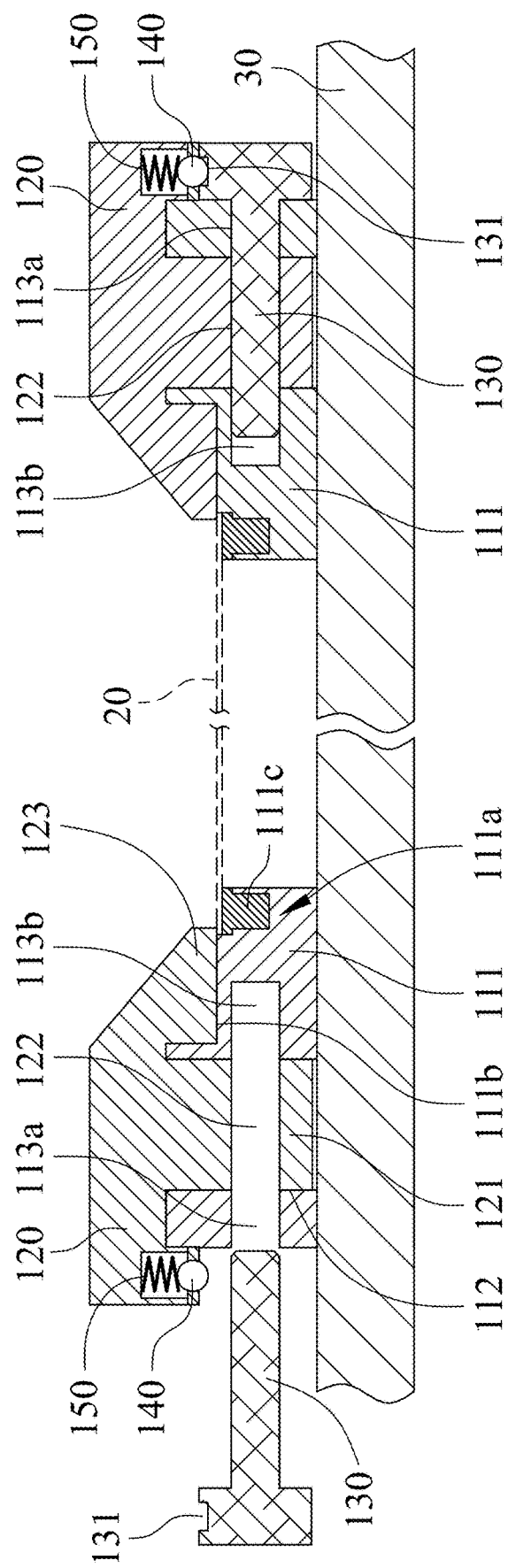
FIG. 6 is a cross-section view along A-A line of FIG. 1.

With reference to FIGS. 1, 5 and 6, before using the clamp assembly 10 to clamp the workpiece 20 in electroless plating, etching, electroplating or cleaning process, the base 110 and the blocking element 200 are mounted on the carrier 30, and the workpiece 20 is placed on the base 110. In this embodiment, the workpiece 20 is placed on the first clamping portion 111a of the body 111 of the base 110. With reference to FIG. 5, there are a recess 111b and a clamp pad 111c arranged on the first clamping portion 111a of the body 111, the clamp pad 111c is placed in the recess 111b, the workpiece 20 is placed on the clamp pad 111c and its edge 21 is abutted against a recess wall 111d of the recess 111b.

Figure 7:
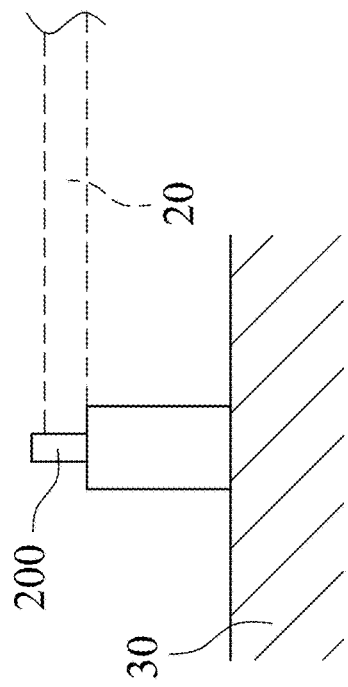
FIG. 7 is a cross-section view along B-B line of FIG. 1.

With reference to FIGS. 1 and 7, the blocking element 200 is provided to contact the workpiece 20 so as to stop rotation of the workpiece 20. In this embodiment, the workpiece 20 is a wafer, and the wafer is placed on the base 110 to allow a notch on the wafer to contact the blocking element 200 thereby preventing rotation of the wafer on the base 110.

With reference to FIGS. 5 and 6, after placing the workpiece 20 on the base 110, the clamping element 120 is moved toward the base 110 to allow the guide rod 121 of the clamping element 120 to be inserted into the guide hole 112 of the base 110 and allow the second limiting hole 122 on the clamping element 120 to be aligned and communicated with the first limiting hole 113 on the base 110. The limiting element 130 can be inserted into the first limiting hole 113 of the base 110 and the second limiting hole 122 of the clamping element 120 via an opening 113c of the first limiting hole 113. The limiting element 130 is inserted into at least the first portion 113a of the first limiting hole 113 and the second limiting hole 122 to integrate the base 110 with the clamping element 120 and allow the workpiece 20 to be clamped between the first clamping portion 111a of the body 111 of the base 110 and the second clamping portion 123 of the clamping element 120. And preferably, the limiting element 130 is also inserted into the second portion 113b of the first limiting hole 113.

In this embodiment, the workpiece 20 is clamped between the second clamping portion 123 and the clamp pad 111c placed on the first clamping portion 111a so as to prevent the workpiece 20 from separating from the base 110. Preferably, the clamp pad 111c is made of a soft material, such as silicon or rubber. While the workpiece 20 is clamped between the first clamping portion 111a and the second clamping portion 123, the clamp pad 111c is compressed to generate a return force on the workpiece 20. And after inserting the limiting element 130 into the first limiting hole 113 and the second limiting hole 122, the return force of the clamp pad 111c can be added to the clamping force for clamping the workpiece 20 between the clamp pad 111c and the second clamping portion 123 to position the limiting portion 130 in the first limiting hole 113 and the second limiting hole 122.

With reference to FIGS. 5 and 6, when the limiting element 130 is inserted into the first limiting hole 113 and the second limiting hole 122 and moved to a predetermined position, the positioning element 140 is accommodated in a positioning hole 131 on the limiting element 130 to fix the limiting element 130 and prevent the limiting element 130 from moving out of the first limiting hole 113 and the second limiting hole 122.

With reference to FIGS. 5 and 6, in order to get out the workpiece 20, the limiting element 130 is drawn out firstly to allow the positioning hole 131 of the limiting element 130 to move away from the positioning element 140, thus the limiting element 130 can be separated from the first limiting hole 113 and the second limiting hole 122. Then, the clamping element 120 can be removed to take the workpiece 20 out of the clamp assembly 10.

With reference to FIGS. 2 to 6, a limiting recess 111e is provided on the base 110, and the second clamping portion 123 is accommodated in the limiting recess 111e as the clamping element 120 is integrated with the base 110. Owing to the second clamping portion 123 is limited in the limiting recess 111e, the clamping element 120 cannot rotate.

Because the guide rod 121 of the clamping element 120 is designed to be inserted into the guide hole 112 of the base 110 and the limiting element 130 is designed to be inserted into the first limiting hole 113 and the second limiting hole 122, the clamping element 120 can be integrated with the base 110 quickly and cannot be separated from the base 100 easily. And the clamping element 120 can be removed from the base 110 to take out the workpiece 20 as pulling the limiting element 130 out of the first limiting hole 113 and the second limiting hole 122, assembly and disassembly processes for the clamp 100 is simplified in the present invention. In addition, contamination induced by residual electroplating liquid or residual clean liquid is avoidable owing to the base 110, the clamping element 120 and the limiting element 130 of the clamp 100 have simple structures.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A clamp assembly comprising at least one clamp which is configured to clamp a workpiece, the at least one clamp comprising:
   a base configured to be mounted on a carrier and including a body, a guide hole and a first limiting hole, the body includes a first clamping portion, the guide hole and the first limiting hole are located on the body and communicated with each other, and the guide hole and the first limiting hole are arranged with an included angle;
   a clamping element including a guide rod, a second limiting hole and a second clamping portion, the second limiting hole is located on the guide rod, the guide rod is configured to be inserted into the guide hole to allow the second limiting hole to be communicated with the first limiting hole; and
   a limiting element configurated to be inserted into the first and second limiting holes to integrate the base with the clamping element and allow the workpiece to be clamped between the first and second clamping portions.

2. The clamp assembly in accordance with claim 1, wherein the first limiting hole includes a first portion and a second portion which are communicated with the guide hole, the guide hole is located between the first and second portions, the limiting element is configured to be inserted into the first portion of the first limiting hole and the second limiting hole.

3. The clamp assembly in accordance with claim 1, wherein the first limiting hole includes a first portion and a second portion which are communicated with the guide hole, the guide hole is located between the first and second portions, the limiting element is configured to be inserted into the first portion of the first limiting hole, the second limiting hole and the second portion of the first limiting hole.

4. The clamp assembly in accordance with claim 1, wherein the base further includes a limiting recess which is configured to accommodate the second clamping portion of the clamping element.

5. The clamp assembly in accordance with claim 4, wherein the first clamping portion of the body of the base includes a clamp pad, and the workpiece is configured to be clamped between the second clamping portion and the clamp pad of the first clamping portion.

6. The clamp assembly in accordance with claim 5, wherein the first clamping portion of the body of the base further includes a recess, the clamp pad is configured to be placed in the recess, and an edge of the workpiece is configured to be abutted against a recess wall of the recess.

7. The clamp assembly in accordance with claim 1, wherein the first clamping portion of the body of the base includes a clamp pad, and the workpiece is configured to be clamped between the second clamping portion and the clamp pad of the first clamping portion.

8. The clamp assembly in accordance with claim 7, wherein the first clamping portion of the body of the base further includes a recess, the clamp pad is configured to be placed in the recess, and an edge of the workpiece is configured to be abutted against a recess wall of the recess.

9. The clamp assembly in accordance with claim 1, wherein the at least one clamp further includes a positioning element which is configured to be mounted on the clamping element, a positioning hole located on the limiting element is configured to accommodate the positioning element.

10. The clamp assembly in accordance with claim 9, wherein the at least one clamp further includes an elastic element which is configured to be mounted on the clamping element, the elastic element is configured to push the positioning element to allow the positioning element to be accommodated in the positioning hole located on the limiting element.

11. The clamp assembly in accordance with claim 1 further comprising a blocking element, wherein the blocking element is configured to be mounted on the carrier and configured to contact the workpiece.

\* \* \* \* \*